United States Patent

Matsumura et al.

[19]

[11] Patent Number: 5,040,143
[45] Date of Patent: Aug. 13, 1991

[54] SEMICONDUCTOR MEMORY DEVICE
[75] Inventors: Tetsuya Matsumura; Masahiko Yoshimoto, both of Hyogo, Japan
[73] Assignee: Mitsubishi Denki Kabushiki Kaisha, Tokyo, Japan
[21] Appl. No.: 526,138
[22] Filed: May 22, 1990
[51] Int. Cl.$^5$ .................... G11C 13/00; G11C 5/06
[52] U.S. Cl. .................................... 365/51; 365/63
[58] Field of Search ............ 365/51, 63, 182, 189.02, 365/230.02, 154

[56] References Cited

U.S. PATENT DOCUMENTS 4,964,078 10/1990 Jandu et al. ...................... 365/51

FOREIGN PATENT DOCUMENTS 60-79597 10/1983 Japan .
61-3395 6/1984 Japan .

*Primary Examiner*—Terrell W. Fears
*Attorney, Agent, or Firm*—Lowe, Price, LeBlanc and Becker

[57] ABSTRACT

First and second supply lines are connected to some or all of a plurality of memory cells included in a memory cell array. Only the first supply line is connected to the remaining memory cells. When a voltage of H level is supplied to the first and second supply lines, all memory cells function as SRAM memory cells in which stored information can be rewritten. Meanwhile when H level is applied to the first supply line and L level is applied to the second supply lines, memory cells to which both the first and second supply lines are connected are set to a state in which information of the logic "1" or "0" is fixedly stored. Namely, they function as ROM memory cells. At this time, the remaining member cells to which only the first supply line is connected function as SRAM memory cells. In this manner, by switching the voltages applied to the second supply line, some or all of the memory cell arrays function as SRAM or ROM.

5 Claims, 6 Drawing Sheets

FIG.5

| MEMORY CELL | CASE 1 | CASE 2 | CASE 3 | CASE 4 |
|---|---|---|---|---|
| | SRAM CELL | SRAM CELL | SRAM CELL / RW CELL | SRAM CELL / RW CELL |
| Vcc1 = "H" Vcc2 = "H" | 1 | 0 | x | x |
| Vcc1 = "H" Vcc2 = "L" | 1 | 0 | x | x |
| Vcc1 = "L" Vcc2 = "H" | 0 | 1 | x | x |
| Vcc1 = "L" Vcc2 = "L" | x | x | x | x |

SEMICONDUCTOR MEMORY DEVICE

BACKGROUND OF THE INVENTION

1. Field of the Invention

The present invention relates to a semiconductor memory device and, more specifically, to a semiconductor memory device which can be used both as a static random access memory (hereinafter referred to as an SRAM) and a read only memory (hereinafter referred to as a ROM).

2. Description of the Background Art

FIG. 1 is a block diagram showing a structure of a conventional general SRAM. Referring to the figure, a plurality of word lines WL1, WL2, WL3, WL4 . . . are provided in a memory cell array 1. A plurality of bit lines BL1, $\overline{BL1}$, BL2, $\overline{BL2}$ . . . are arranged intersecting these word lines in the memory cell array 1.

The adjacent bit lines constitute bit line pairs. For example, bit lines BL1 and $\overline{BL1}$ form a bit line pair, and bit lines BL2 and $\overline{BL2}$ form a bit line pair. A memory cell 2 (shown by a hatched potion in FIG. 1) is arranged at each of the intersections between the word lines and the bit line pairs. A supply line 3 and a ground line 4 are connected to the memory cell array 1. A supply voltage Vcc (hereinafter this voltage is regarded as H level) applied to the supply line 3 and a ground voltage 0 V (hereinafter, this voltage is regarded as L level) applied to the ground line 4 are applied to each memory cell 2. A row decoder 5, a column decoder 6 and an input/output circuit 8 are provided related to the memory cell array 1. The row decoder 5 decodes a row address signal applied through an address input line 7 to select one of the plurality of word lines, and applies a voltage of H level to the selected word lines. The input/output circuit 8 comprises a plurality of switching circuits provided for respective bit line pairs, and one or a plurality of sense amplifiers posed between a data input/output line 9 and the switching circuits. The column decoder 6 decodes a column address signal applied through the address input line 7 to select one of the plurality of switching circuits in the input/output circuit 8 to render conductive the selected switching circuit. Therefore, one of the plurality of memory cells 2 is selected by the row decoder 5 and the column decoder 6.

FIG. 2 is a schematic diagram showing the structure of the memory cell 2 shown in FIG. 1. Referring to the figure, the memory cell 2 comprises N channel MOS transistors 21 and 22 forming a flipflop, high resistance load elements 23 and 24, and N channel MOS transistors 25 and 26 forming a transfer gate. Each of the high resistance load elements 23 and 24 has one end connected to the supply line 3. A transistor 21 is interposed between the other end of the high resistance load element 23 and the ground line 4. A transistor 22 is interposed between the other end of the high resistance load element 24 and ground line 4. The gate of the transistor 21 is connected to the other end of the high resistance load element 24. The gate of the transistor 22 is connected to the other end of the high resistance load element 23. A Transistor 25 is interposed between a bit line BLn (n is an arbitrary positive integer) and the high resistance load element 23. A transistor 26 is interposed between the bit line $\overline{BLn}$ and the other end of the high resistance load element 24. The gates of transistors 25 and 26 are connected to corresponding word lines WLn.

The writing and reading operations of the conventional SRAM shown in FIGS. 1 and 2 will be described in the following.

Writing Operation

First, a word line WLn is selected by the row decoder 5, and a voltage of H level is applied to the word line WLn. Consequently, the transistors 25 and 26 are turned on. A switch circuit corresponding to the bit line pair BLn, $\overline{BLn}$ out of the plurality of switching circuits in the input/output circuit 8 is rendered conductive by the column decoder 6. Consequently, write data are applied to the bit line pair BLn, $\overline{BLn}$ through the data input/output line 9. Assuming that a voltage of H level is applied to the bit line $\overline{BLn}$ and a voltage of L level is applied to the bit line e,ovs/BL/ n as the write data at this time, the nodes e and c of FIG. 2 attain to the H level, and the transistor 22 is turned on. Consequently, the potential at the node d attains to the L level, and the transistor 21 is kept off. Therefore, the potential at the node c is pulled up through the high resistance load element 23 to maintain the H level. Accordingly, the potential of the node c is set to the H Level, and the potential of the node d is set to the L level. This state is regarded as a state in which the memory cell 2 stores the logic "1". Meanwhile, if a voltage of L level is applied to the bit line BLn and a voltage of H level is applied to the bit line $\overline{BLn}$ as the write data, an operation completely opposite to the above operation is carried out. Namely, the transistor 21 is turned on and the transistor 22 is kept off. Consequently, the potential of the node c is set to the L level, while the potential of the node d is set to the H level. The state is regarded as a state in which the logic "0" is stored.

Reading Operation

First, a word line WLn is selected by the row decoder 5. Consequently, the transistors 25 and 26 are turned on, and potentials set at the nodes c and d are read to the bit lines BLn and $\overline{BLn}$. Namely, if the logic "1" is stored in the memory cell 2, the bit line BLn attains to the H level, and the bit line $\overline{BLn}$ attains to the L level. If the logic "0" is stored, the bit line BLn attains to the L level, and the bit line $\overline{BLn}$ attains to the H level. The reading operation is carried out for all the memory cells 2 belonging to the word line WLn selected by the row decoder 5. Thereafter, a switching circuit corresponding to the bit line pair BLn and $\overline{BLn}$ is selected to be rendered conductive, out of the plurality of switches in the input/output circuit 8, by the column decoder 6. Consequently, read data of one memory cell only is applied to a sense amplifier in the input/output circuit 8 through the selected switching circuit to be applied to the data input/output line 9, out of the memory cells 2 of one row selected by the row decoder 5. Consequently, the information stored in the selected one memory cell is read from the data input/output line 9.

In the conventional SRAM shown in FIGS. 1 and 2, each memory cell 2 is capable of static storing of information, provided that the supply voltage Vcc is supplied to the supply line 3. Namely, unlike the dynamic RAM in which memory cells must be refreshed in a prescribed period, the information stored in the memory cells 2 are maintained. However, in the conventional SRAM described above, the information stored in the memory cells 2 are erased when the supply of the supply voltage to the supply line 3 is stopped. Namely, the conventional SRAM has no function of fixedly storing information, that is, the function of a ROM.

However, as various and many systems have been developed recently, semiconductor memory devices having various functions have come to be in great demand. Semiconductor memory devices having functions of both SRAM and ROM have been strongly desired.

SUMMARY OF THE INVENTION

Therefore an object of present invention is to provide a multifunction semiconductor memory device having both functions of a SRAM and a ROM.

The semiconductor memory device in accordance with the present invention comprises a plurality of word lines, a plurality of sets of bit line pairs, a plurality of memory cells, a first supply line, a second supply line and memory cell selecting means. Each of the bit line pairs is arranged to intersect the plurality of word lines. Each of the memory cells is arranged at each of the intersections between the plurality of word lines and plurality of the bit line pairs. The first supply line is connected to each of the plurality of memory cells. The second supply line is also connected to some or all of the plurality of memory cells. The memory cell selecting means selects any of the plurality of memory cells based on an address signal. A memory cell to which the first and the second supply lines are both connected store information in a writable manner when a first voltage is applied to the first and the second supply lines and it fixedly stores a predetermined information when a first voltage is applied to the first supply line and a second voltage is applied to the second supply line.

In accordance with the present invention, a semiconductor memory device can be provided which functions as an SRAM when a first voltage is applied to the first and the second supply lines, and functions as ROM when a first voltage is supplied to the first supply line and a second voltage is applied to the second supply line. Consequently, a multifunction semiconductor memory device which can be widely used can be realized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 shows the operation of the embodiment shown in FIGS. 3 and 4; and

DESCRIPTION OF THE PREFERRED EMBODIMENTS

Figure 1:
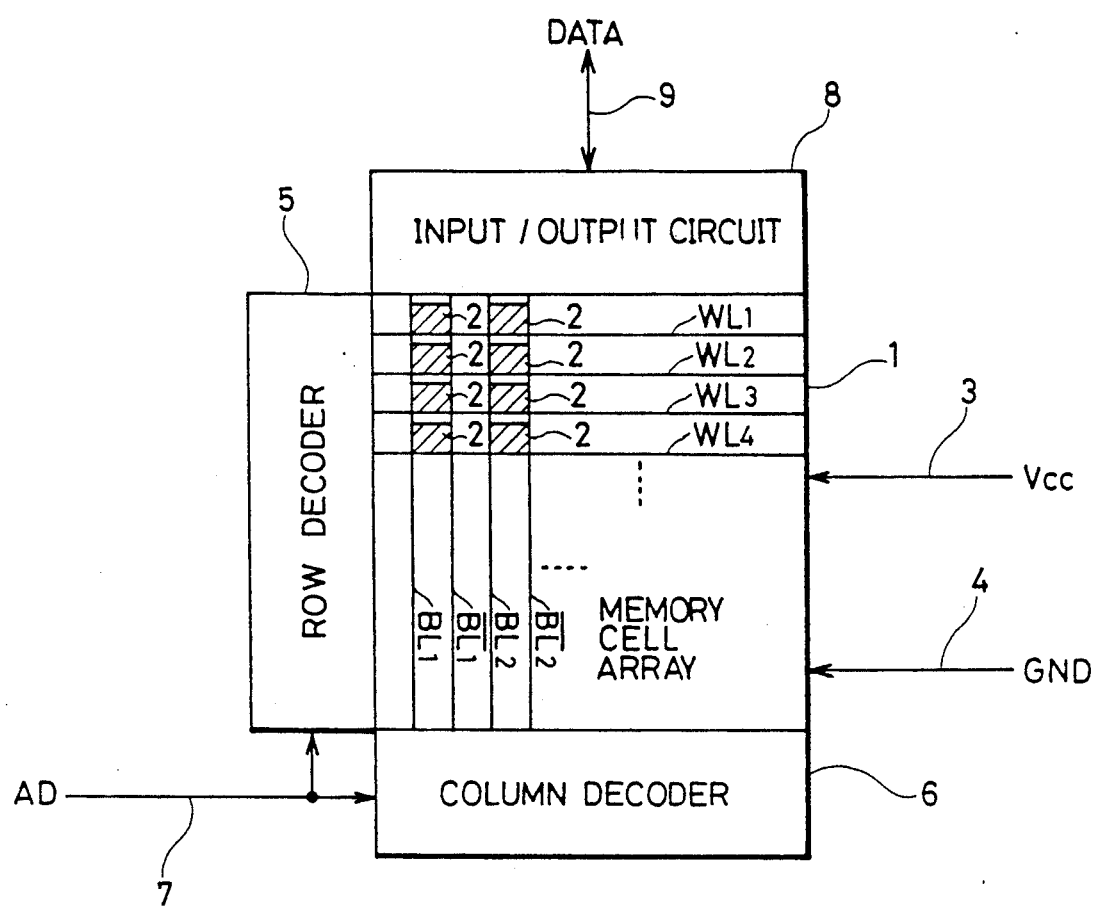
FIG. 1 is a block diagram showing a structure of a conventional SRAM.

The whole structure of the semiconductor memory device in accordance with one embodiment of the present invention will be described with reference to FIG. 3. The embodiment shown in FIG. 3 has the same structure as the conventional SRAM shown in FIG. 1 except the following points, and the same reference characters are allotted to the same or corresponding portions, description of which is not repeated. Referring to the figure, two supply lines 31 and 32 together with the ground line 4 are connected to the memory cell array 100. A voltage Vcc 1 applied to the first supply line 31. A voltage Vcc 2 is applied to the second supply line 32. The first supply line 31 is connected to each memory cell 2' in the memory cell array 100. The second supply line 32 is connected to some or all of the memory cells 2' in the memory cell array 100.

Figure 2:
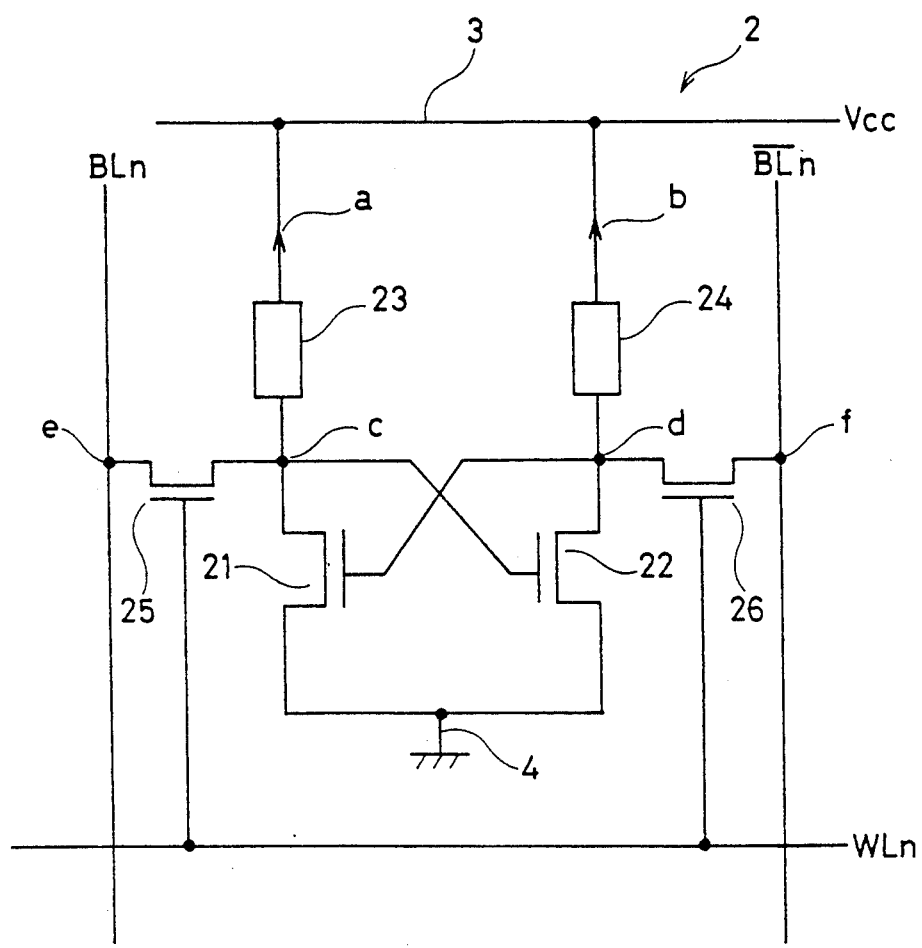
FIG. 2 is a schematic diagram showing a structure of a memory cell used in the conventional SRAM shown in FIG. 1.
Figure 3:
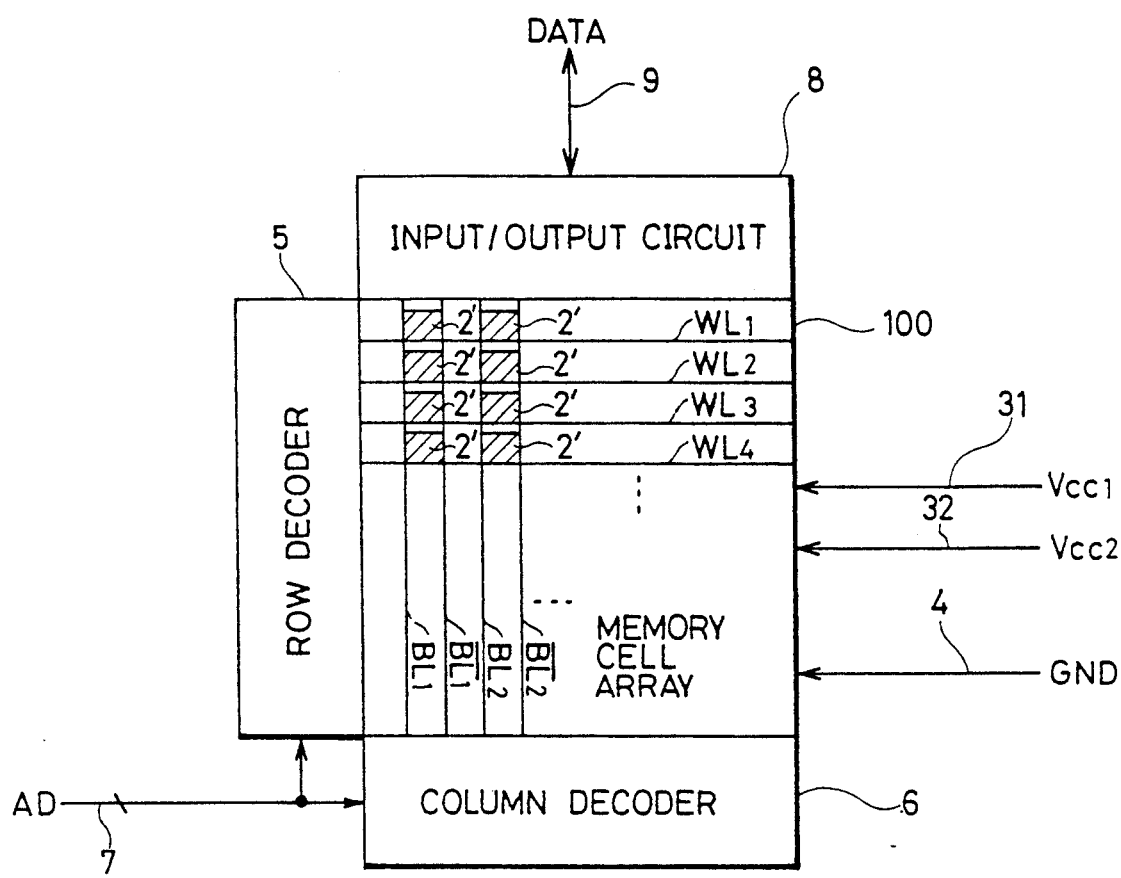
FIG. 3 is a block diagram showing a structure of the semiconductor memory device in accordance with one embodiment of the present invention.
Figure 4:
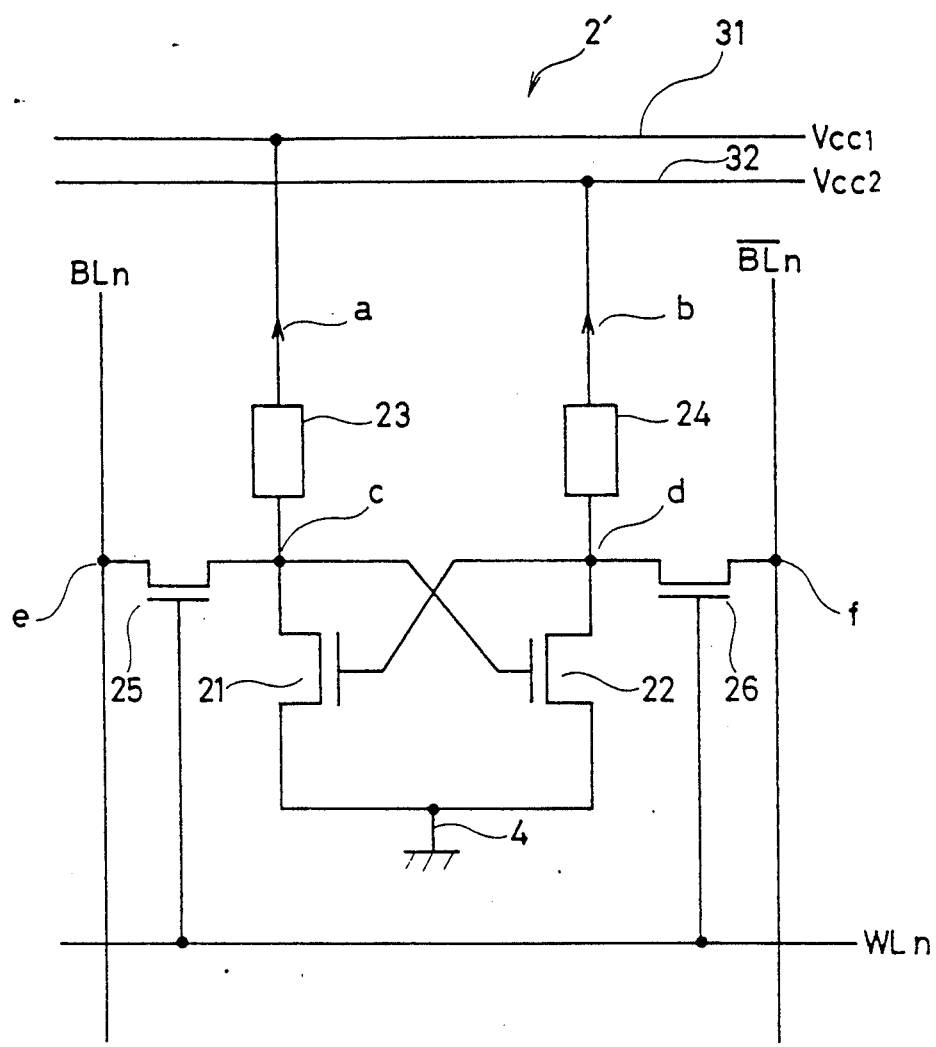
FIG. 4 a schematic diagram showing a structure of the memory cell used in the embodiment shown in FIG. 3.

The structure of each memory cell 2' provided in the memory cell array 100 of FIG. 3 is shown in FIG. 4. As shown in the figure, the structure of the memory cell 2' is almost the same as that of memory cell 2 in the conventional SRAM shown in the FIG. 2. More specifically, the memory cell 2' comprises N channel MOS transistors 21 and 22 forming a flipflop, high resistance load elements 23 and 24, and N channel MOS transistor 25 and 26 forming a transfer gate. However, one end of the high resistance load element 23 is connected to the first or second supply line 31 or 32. One end of the high resistance load element 24 is connected to the first or second supply line 31 or 32. FIG. 4 shows a case in which one end of the high resistance load element 23 is connected to the first supply line 31, while one end of the high resistance load elements 24 is connected to the second supply line 32. Connection of one end of each of the high resistance load elements 23 and 24 to the first o second supply line 31 or 32 is determined dependent on whether the memory cell 2' is to be used only as the SRAM cell or both as the SRAM cell and the ROM cell.

The operation of the memory cell 2' shown in FIG. 4 will be described in the following, referring to the following four cases.

(1) When Vcc 1 = Vcc 2 = "H"

In this case, the memory cell 2', operates as a common SRAM memory cell capable of writing/reading, in the same manner as the conventional memory cell 2' shown in FIG. 2.

(2) When Vcc 1 = "H" and Vcc 2 = "L"

In this case, since the voltage Vcc 2 is at the L level, the potentials at the nodes b and d are both L level. Consequently, the transistor 21 is turned off. Accordingly, the potential of the node c is pulled up to the voltage Vcc 1, that is, H level. The transistor 22 is turned on. Consequently, the potential of the node c is latched at the H level, while the potential at the node d is latched at the L level.

In this state, when reading operation is done for the memory cell 2', namely, when the potential of word line WLn is raised, information of H level appears on the bit line BLn while information of L level appears on the bit line $\overline{BLn}$. Namely, the memory cell 2' stores the information of the logic "1".

(3) When Vcc 1 = "L" and Vcc 2 = "H"

In this case, the memory cell 2' operates in a manner opposite to the above operation (2). Namely, the memory cell 2' stores the information of the logic "0".

(4) When Vcc 1="L" and Vcc 2="L"

In this case, reading operation from the memory cell 2' can not be carried out. The reason for this is that the potentials at the nodes c and d are both L level, and therefore the logic information can not be defined.

The connection between the high resistance load elements 23 and 2 and the first and the second supply lines 31 and 32 in the memory cell 2' can be divided into four cases as shown in FIG. 5. Namely, in the case 1, the high resistance load element 23 is connected to the first supply line 31, while the high resistance load element 24 is connected to the second supply line 32. In the case 2, the high resistance load element 23 is connected to the second supply line 32 and the high resistance load element 24 is connected to the first supply line 31. In the case 3, the high resistance load elements 23 and 24 are both connected to the first supply line 31. In the case 4, the high resistance load elements 23 and 24 are both connected to the second supply line 32. The state of operations (1) to (4) described above correspond to the case 1 of FIG. 5.

Referring to FIG. 5, the mark X shows that normal writing and reading can not be done in the state, and it is prohibited in principle to set the memory cell 2' to such states. Now, when the supply line 31 is defied as a supply line for applying a voltage to the whole semiconductor memory device of the present embodiment and the second supply line 32 is defined as a supply line for switching between the SRAM and ROM, the states of operation of the memory cell 2' can be changed in the range denoted by the dotted line in FIG. 5. This will be described in greater detail in the following with reference to FIGS. 6A to 6C.

Figure 6A:
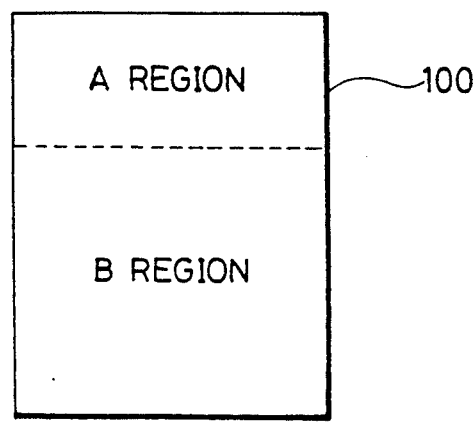
FIGS. 6A to 6C show one example of a use of the embodiment shown in FIGS. 3 and 4.

Referring to FIG. 6A, the memory cell array 100 shown in FIG. 3 is divided into A region and B region. Memory cells 2' in the A region are connected to the first and the second supply lines 31 and 32 in the manner of the case 1 or case 2 of FIG. 5, dependent on the content of the information which is to be fixedly set. Namely, when the information of the logic "1" is to be fixedly set in the memory cell 2', the memory cell 2' is connected to the first and the second supply lines 31 and 32 in the manner of the case 1 shown in FIG. 5. If the information of the logic "0" is to be fixedly set in the memory cell 2', the memory cell 2' is connected to the first and second supply lines 31 and 32 in the manner of the case 2 of FIG. 5. Meanwhile, the memory cells 2' in the B region are connected in the manner of the case 3 of FIG. 5. Namely, the high resistance load elements 23 and 24 are both connected to the first supply line 31.

Figure 6B:
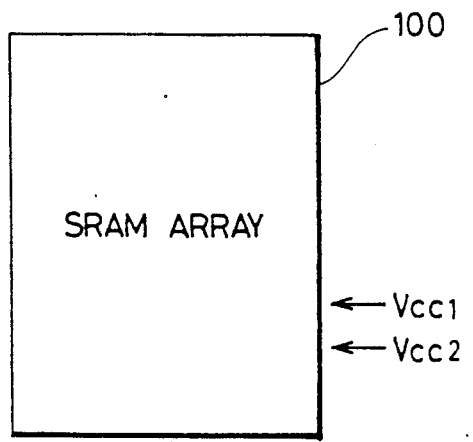

When the semiconductor memory device described with reference to FIG. 6A is used with Vcc 2="H", the memory cells 2' of the memory cell array 100 operate as SRAM memory cells both in the A and B regions, as shown in FIG. 6B. Therefore, the semiconductor memory device shown in FIG. 3 functions as a common SRAM.

Figure 6C:
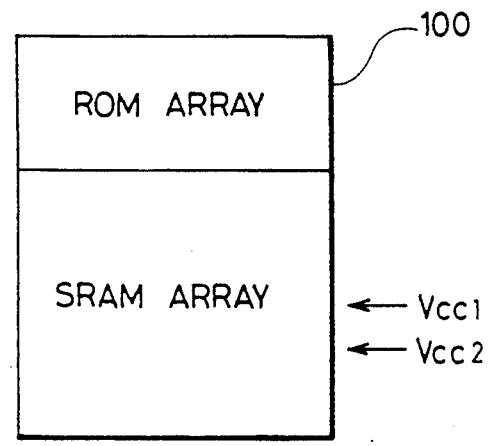

If Vcc 2="L", the memory cells 2' in the A region of the memory cell array 100 serve as ROM memory cells which are programmed in advance, and the memory cells 2' in the B region serve as common SRAM memory cells, as shown in FIG. 6C.

If the memory cell array 100 is entirely formed of the memory cells of the case 1 or the the case 2 of FIG. 5, the memory cell array 100 as a whole can be used as a RAM or a ROM by switching the Vcc 2. It goes without saying that the supply line of the peripheral circuits of the memory cell array 100 is connected to the first supply line 31 (to which H level is constantly supplied).

The present invention can be applied not only to a single SRAM or ROM chip but to RAM and ROM used as core cells in a microprocessor, for example. Therefore, the voltages applied to the first and the second supply lines 31 and 32 may be externally applied, and they may be applied from a voltage generating circuit formed on the same chip as the semiconductor memory device of FIG. 3.

Since the semiconductor memory device of the present embodiment described above has both functions of SRAM and ROM, it can be used in various manners. For example, a test program for a user may be stored in the A region which can operate as a ROM in the memory cell array 100, and the test may be carried out in accordance with the test program, if necessary. A basic application program may be stored in the A region, and the system may be operated in accordance with the application program. If the user does not desire the use of such an application program, the A region may be used switched to the SRAM region. There are various other manners of use.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having both functions of a static random access memory and of a read only memory, comprising:
   a plurality of word lines;
   a plurality of sets of bit line pairs arranged to intersect said plurality of word lines;
   a plurality of memory cells arranged at intersections of said plurality of word lines and said plurality of sets of bit line pairs;
   a first supply line connected to each of said plurality of memory cells;
   a second supply line connected to some or all of said plurality of memory cells; and
   memory cell selecting means for selecting any of said plurality of memory cells based on an address signal; wherein
   a memory cell to which both of said first and second supply lines are connected stores information in a writeable manner when a first voltage is applied to said first and second supply lines, and fixedly stores a predetermined information when the first voltage is applied to said first supply line and a second voltage is applied to said second supply line.

2. A semiconductor memory device according to claim 1, wherein
   said memory cell to which both of said first and second supply lines are connected comprises:
   first resistance means having one end connected to one of said first and second supply lines;
   second resistance means having one end connected to the other one of said first and second supply lines;
   a first transistor interposed between the other end of said first resistance means and a reference potential source, having its gate connected to the other end of said second resistance means;
   a second transistor interposed between the other end of said second resistance means and the reference potential source, having its gate connected to the other end of said first resistance means;

a third transistor interposed between the other end of said first resistance means and one bit line of a corresponding bit line pair, having its gate connected to corresponding one of said word lines; and a fourth transistor interposed between the other end of said said second resistance means and the other bit line of said corresponding bit line pair, having its gate connected to one of said word lines.

3. A semiconductor memory device according to claim 2, wherein said first voltage is selected to be sufficiently higher than the potential of said reference potential source, and said second voltage is selected to be approximately equal to the reference potential source.

4. A semiconductor memory device according to claim 3, wherein said memory cell to which both of said first and second supply lines are connected is divided into a first memory cell in which one end of said first resistance means is connected to said first supply line and one end of said second resistance mans is connected to said second supply line, and a second memory cell in which one end of said first resistance means is connected to said second supply line and one end of said second resistance means is connected to said first supply line; and said first memory cell is set in a state in which information of logic "1" is fixedly stored and said second memory cell is set in a state in which information of logic "0" is fixedly stored, when said first voltage is applied to said first supply line and said second voltage is supplied to said second supply line.

5. A semiconductor memory device according to claim 1, wherein a memory cell to which only said first supply line out of said first and second supply lines is connected stores information only in a rewritable manner when said first voltage is applied to said first supply line, irrespective of the voltage applied to said second supply line.

* * * * *